(12) United States Patent
Lai et al.

(10) Patent No.: US 7,772,607 B2
(45) Date of Patent: Aug. 10, 2010

(54) GAN-SERIES LIGHT EMITTING DIODE WITH HIGH LIGHT EFFICIENCY

(75) Inventors: Mu-Jen Lai, Pingjhen (TW); Schang-Jin Hon, Pingjhen (TW)

(73) Assignee: Supernova Optoelectronics Corporation, Taoyuan County (TW)

( * ) Notice: Subject to any disclaimer, the term of this patent is extended or adjusted under 35 U.S.C. 154(b) by 101 days.

(21) Appl. No.: 11/647,251

(22) Filed: Dec. 29, 2006

(65) Prior Publication Data
US 2007/0108457 A1    May 17, 2007

Related U.S. Application Data

(63) Continuation-in-part of application No. 10/950,132, filed on Sep. 27, 2004, now abandoned.

(51) Int. Cl.
*H01L 31/0232* (2006.01)
(52) U.S. Cl. .................. 257/98; 257/102; 257/103; 257/E33.025
(58) Field of Classification Search .................. 257/98, 257/102–103, E33.025
See application file for complete search history.

(56) References Cited
U.S. PATENT DOCUMENTS

| 7,193,246 B1 * | 3/2007 | Tanizawa et al. ............... 257/94 |
| 2006/0202226 A1 * | 9/2006 | Weisbuch et al. ............ 257/103 |
| 2007/0187712 A1 * | 8/2007 | Yamada et al. ............... 257/103 |

* cited by examiner

*Primary Examiner*—Allan R. Wilson
(74) *Attorney, Agent, or Firm*—Rosenberg, Klein & Lee

(57) ABSTRACT

A GaN-series light emitting diode with high light efficiency utilizes a p-type semiconductor layer having a textured surface structure. The optical waveguide effect can be interrupted and formation of hexagonal shaped pits defect can be reduced due to the textured structure. The p-type semiconductor layer is formed on a light emitting layer and includes a p-type cladding layer, p-type transitional layer, and p-type ohmic contact layer. During the manufacturing of the GaN-series LED, the tension and compression of strain is controlled while the p-type cladding layer and the p-type transition layer are formed. Through the control of the epitaxial growth process, it is attained that the surface of the p-type semiconductor layer is textured to increase external quantum efficiency and the operation life of the light emitting device.

18 Claims, 6 Drawing Sheets

GAN-SERIES LIGHT EMITTING DIODE WITH HIGH LIGHT EFFICIENCY

REFERENCE TO RELATED APPLICATION

This application is being filed as a Continuation-in-Part application of patent application Ser. No. 10/950,132, filed 27 Sep. 2004, now abandoned.

BACKGROUND OF THE INVENTION

1. Field of the Invention

The present invention relates to a GaN-series light emitting diode with high light efficiency and its manufacturing method, especially to a GaN-series light emitting diode and its manufacturing method, in which the strain of epitaxy layer is controlled during the process of epitaxial growth to form a p-type semiconductor layer with surface textured structure to interrupt the optical waveguide effect.

2. Description of the Related Art

A sapphire substrate grown GaN-series light emitting diode, according to prior art, shown in FIG. 1 has a so-called conventional structure, consisting of a GaN buffer layer 2, a n-type GaN ohmic contact 3, a InGaN light emitting layer 4, a p-type AlGaN cladding layer 5 and a p-type GaN ohmic contact layer 6 epitaxially grown sequentially on the sapphire substrate 1. A semi-transparent metal conductive layer 7 is formed on the p-type GaN ohmic contact layer 6, a p-side electrode 8 is formed on the semi-transparent metal conductive layer 7, and a n-side electrode 9 is formed on the GaN ohmic contact 3. Because of the refraction index distribution of said GaN epitaxial structure (n=2.4), sapphire substrate (n=1.77) and resin capping materials for packaging (n=1.5), only 25% of the light emitting from the light emitting layer can be output directly and not be reflected by the interface. 75% of the light are limited by the optical waveguide structure composed of the sapphire substrate and resin capping materials for packaging where light reabsorption takes place due to multiple interface reflection, thus preventing effective extraction of the generated light for utilization. The light extracting efficiency of said light emitting diode is limited by the absorption of the light at the semi-transparent metal conductive layer and reabsorption at the internal epitaxial structure.

A method of interrupting the optical waveguide effect is presented in U.S. Pat. No. 6,091,085 which improves the extracting efficiency of the LED by forming a rough texturing on the surface of sapphire substrate, and then growing multi-layer epitaxial structure of GaN-series of light emitting diode. Alternatively, the epitaxial structure of GaN-series of light emitting diode is grown directly on the sapphire substrate, and then tunnel channels are formed on the surface of the epitaxial structure. The tunnel channels extend in the direction of the sapphire substrate and contain the materials whose refraction index is smaller than the one (n=2.4) of multi-layer GaN epitaxial structure.

However, because the first method requires mechanical polishing or chemical etching to produce the rough texturing, it may cause the non-uniformity of surface roughness on the sapphire substrate, which may affect the conditions of the subsequent epitaxial structure, thus reducing the manufacturing yield. While the second method increases the complexity of fabrication and manufacturing cost due to fabrication of tunnel channels and embedded materials.

U.S. Pat. No. 6,495,862 discloses GaN-series of light emitting diode having convex contoured surface to reduce the reflection of the light emitted from the light emitting layer by semi-transparent metal conductive layer and the interface of resin capping for packaging and to increase the external quantum efficiency. However, making the surface with cylindrical or semi-circle convex texture is complex and expensive.

U.S. Pat. No. 6,531,710 discloses a method in which the optical waveguide effect is interrupted and flexural distortion generated from stress is reduced as the result of the epitaxy process which utilizes an epitaxially gown internal layer of AlN having reticulate linear structure located between the light emitting layer and sapphire substrate to interrupt the optical waveguide effect and to increase external quantum efficiency. This structure may be formed of a metal reflection layer on the AlN internal layer to reflect the light from the light emitting layer towards the sapphire substrate to increase external quantum efficiency. The method includes injecting ammonia gas (NH3) and trimethyalumium (TMA) into reaction chamber and controlling the flow of ammonia gas, while the internal layer of AlN is grown by utilizing the metal organic chemical vapor deposition (MOCVD), to achieve control of the reticulate linear shape, followed by the growth of multi-layer epitaxial structure. However, this method may easily cause the hexagonal shaped pits, as presented in the thesis (APL 71, (9), Sep. 1(1997), P. 1204). If the pits extend to the surface of p-type ohmic contact layer from the internal layer of AlN, metal atoms diffusion into the light emitting layer may happen which can disrupt the characteristics of light emitting diode device and shorten the operation life of the device when the consecutive semi-transparent conductive metal layer or metal electrode are formed.

According to the thesis of J. L. Rouviere et al (Journal of Nitride-Semiconductor-Research, Vol. 1, (1996) Art. 33), three types of surfaces may be formed (hexagonal pyramid shaped roughness, flat, and granular roughness) as the result of different conditions of epitaxial growth, of the thin film of GaN on the sapphire substrate by using MOCVD. The experiment proves that the shape of the surface is determined by the polarization direction and migration rate of surface atoms. When the mechanism of surface growth is mainly controlled by the N-polarity, the surface is rough; when the mechanism of surface growth is mainly controlled by the Ga-polarity, the surface is flat; and when the surface of GaN thin film is flat, the possibility of formation of hexagonal shaped pits is substantially reduced.

Therefore, providing a novel high light efficiency of GaN-series of light emitting diode and the manufacturing method thereof can eliminate the drawbacks of the prior arts, such as mechanical polishing or chemical etching to interrupt the optical waveguide effect. Based on the inventor's experience in research and development, as well as in sales of the related products for many years, the inventor proposes herein a method to overcome the aforementioned problems for improving a high light efficiency of GaN-series of light emitting diode and the manufacturing method thereof.

SUMMARY OF THE INVENTION

The primary purpose of the present invention is to provide a GaN-series light emitting diode having a high light efficiency and its manufacturing method, which includes controlling the strain of a p-type cladding layer and a p-type transition layer is formed on the cladding layer during their epitaxial growth, followed by formation of a p-type ohmic contact layer on said p-type transition layer. The surface of p-type semiconductor layer has a textured structure. The optical waveguide effect thus can be interrupted and external quantum efficiency may be increased through said textured structure.

The secondary purpose of the present invention is to provide a high light efficiency of GaN-series light emitting diode and its manufacturing method, wherein the generation of hexagonal shaped pits is reduced to increase the operation life of the light emitting diode.

In order to achieve the aforementioned purposes, and to improve the efficiency and characteristics of the device, the present invention provides a method and structure of a p-type semiconductor layer having surface textured structure, which results in interruption of the optical waveguide effect and reduction of the growth of the hexagonal shaped pits. The present invention discloses a method including the steps of epitaxially growing a p-type cladding layer, further growing a p-type transition layer on the cladding layer, controlling the strain during growing the two above layers, then forming a p-type ohmic contact layer on the p-type transition layer, and texture the surface of p-type semiconductor layer, thus achieving increased external quantum efficiency and improved operation life.

These and other objectives of the present invention will no doubt become obvious to those of ordinary skill in the art after reading the following detailed description of the preferred embodiment that is illustrated in the various figures and drawings.

DETAILED DESCRIPTION OF THE PREFERRED EMBODIMENTS

In order to clearly express and explore the feature characteristics and efficiency of the present invention for the committee of patent, the preferred embodiment and detailed description is presented in the following paragraphs.

The present invention is a method and a structure designed to interrupt the optical waveguide effect in order to solve the problems of the prior art light emitting diodes which are the result of the post process such as mechanical polishing, or chemical etching or the MOCVD epitaxy which cause formation of hexagonal shaped pits resulting in insufficient operation life and uncontrolled production yield. Hence, the process and structure of the present invention are novel arts which do not require the post machining process and do not cause growth of the hexagonal shaped pits.

Figure 1:
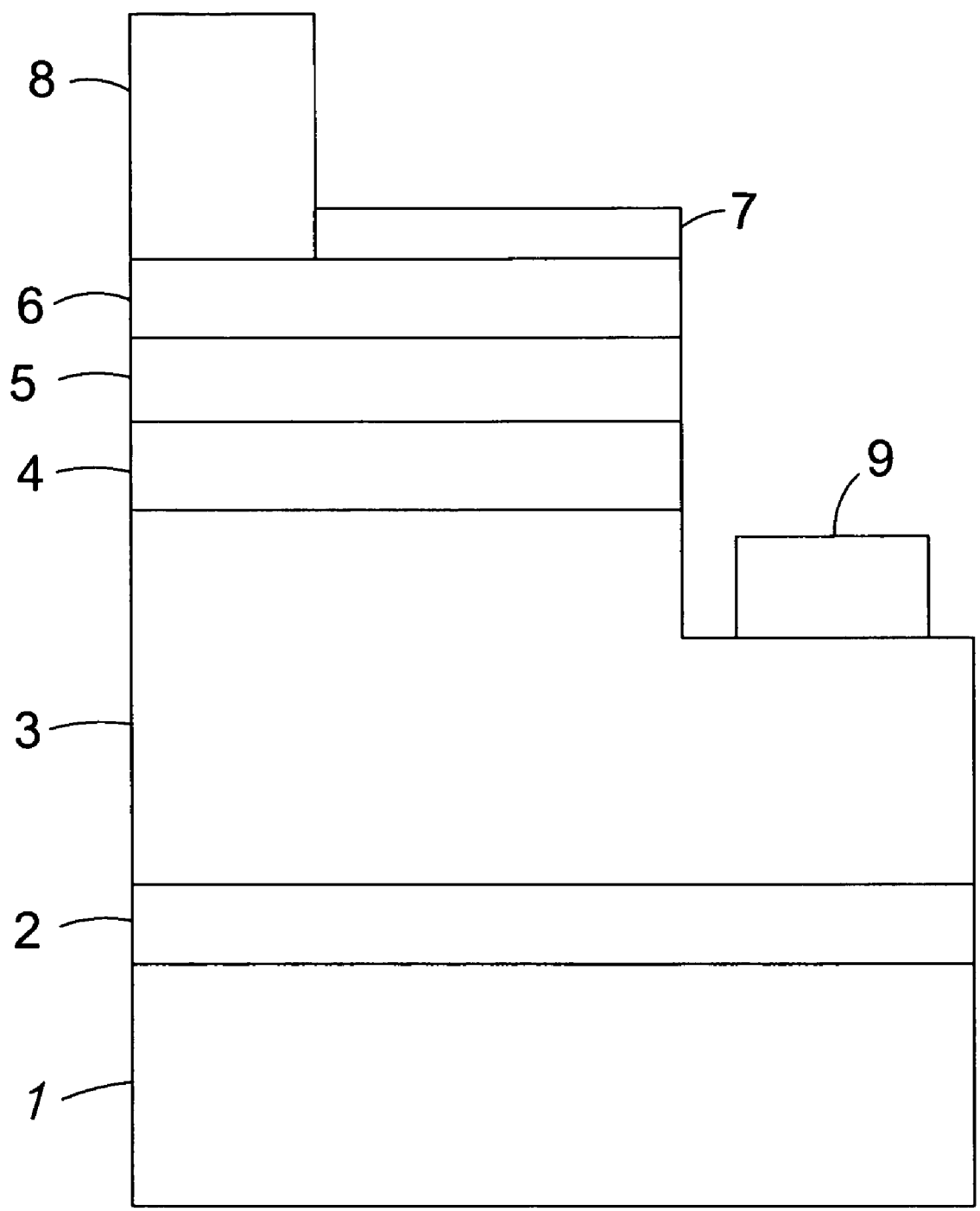
FIG. 1 is a sectional view showing a light emitting diode of the prior art.
Figure 2:
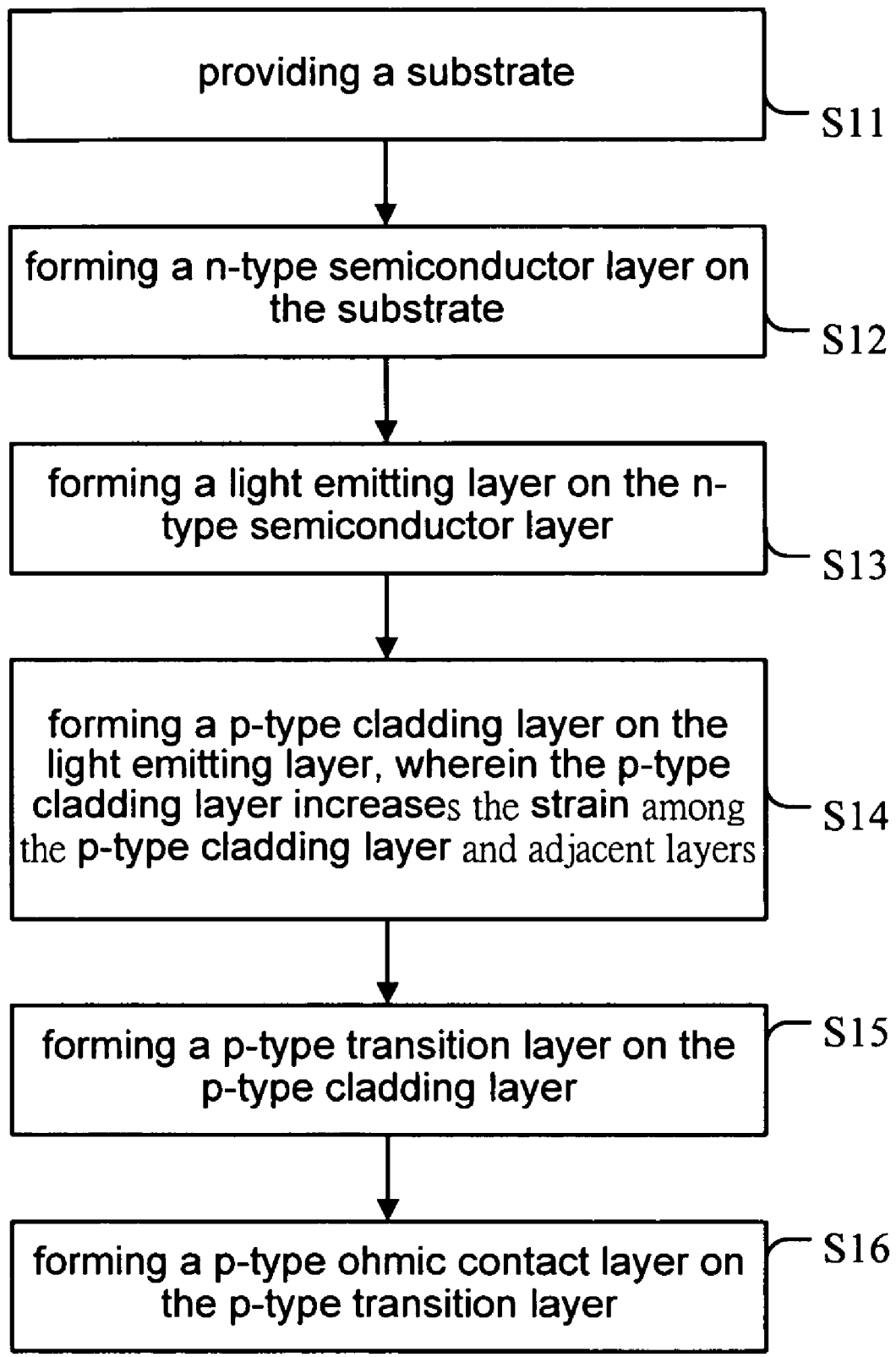
FIG. 2 is a manufacturing flow chart of light emitting diode showing a preferred embodiment in accordance with the present invention.

Referring to FIG. 2 which illustrates the manufacturing flow chart of one of the preferred embodiment of manufacturing the light emitting diode of the present invention, the process comprises the steps of:

Step 11: providing a substrate;
Step 12: forming a n-type semiconductor layer (the n-type semiconductor layer can be a n-type nitride semiconductor contact layer.) on the said substrate;
Step 13: forming a light emitting layer (the light emitting layer can be a nitride semiconductor light emitting layer.) on said n-type semiconductor layer;
Step 14: forming a p-type cladding layer (the p-type cladding layer can be a p-type nitride semiconductor cladding layer.) on the said light emitting layer, wherein said p-type cladding layer has an increased proportion of strain relative to each layer;
Step 15: forming a p-type transition layer (The p-type transition layer can be a p-type nitride semiconductor transition layer.) on said p-type cladding layer; and
Step 16: forming a p-type ohmic contact layer (The p-type ohmic contact layer can be a p-type nitride semiconductor ohmic contact layer.) on said p-type transition layer.

From step 14 to step 16, the increase of the strain of p-type cladding layer (the p-type cladding layer is as a stimulation that increases tension strain.)

and formation of a p-type semiconductor layer with textured surface consists of the steps of:

1. P-type cladding layer contains a magnesium (Mg) dopant with high concentration to increase the strain of epitaxial layers, then the epitaxial growth is interrupted and the interruption time is controlled to alter the strain, wherein the interruption time is between one second to two minutes. Next, growing a p-type transition layer containing a magnesium (Mg) dopant with lower concentration, and lastly growing a p-type ohmic contact layer containing a magnesium (Mg) dopant with proper concentration.

2. P-type cladding layer contains a magnesium (Mg) dopant with high concentration to increase the strain of epitaxial layers, then the epitaxial growth is interrupted and temperature is changed to alter the strain, wherein the temperature is in a range of from 5° C. to 300° C. Next, growing a p-type transition layer containing a magnesium (Mg) dopant with lower concentration, and lastly growing a p-type ohmic contact layer containing a magnesium (Mg) dopant with proper concentration.

3. P-type cladding layer contains a magnesium (Mg) dopant with high concentration to increase the strain of epitaxial layers, then the epitaxial growth is interrupted and one monolayer metal structure or several monolayer metal structures of gallium, indium or aluminum or other III-group elements are formed on the surface of p-type cladding layer to alter the strain in the epitaxial layers, wherein the number of monolayers is from one to five. Next, growing a p-type transition layer containing a magnesium (Mg) dopant with lower concentration, and lastly growing a p-type ohmic contact layer containing a magnesium (Mg) dopant with proper concentration.

4. Increasing aluminum composition of p-type cladding layer to raise the strain of epitaxial layers, then interrupting the epitaxial growth and controlling the interruption time to alter the strain, wherein the interruption time is between one second to two minutes. Next, growing a p-type transition layer containing a magnesium (Mg) dopant with lower concentration, and lastly growing a p-type ohmic contact layer containing a magnesium (Mg) dopant with proper concentration.

5. Increasing aluminum composition of p-type cladding layer to raise the strain of epitaxial layers, then interrupting the epitaxial growth changing temperature to alter the strain of the epitaxial layers, wherein the temperature is in a range of from 5° C. to 300° C. Next, growing a p-type transition layer containing a magnesium (Mg) dopant with lower concentration, and lastly growing a p-type ohmic contact layer containing a magnesium (Mg) dopant with proper concentration.

6. Increasing aluminum composition of p-type cladding layer to raise the strain of epitaxial layer, then interrupting the epitaxial growth and forming several monolayers of gallium, indium or aluminum on the surface of p-type cladding layer to alter the strain of the epitaxial layers, wherein the number of monolayers is from one to five. Next, growing a p-type transition layer containing a magnesium (Mg) dopant with lower concentration, and lastly growing a p-type ohmic contact layer containing a magnesium (Mg) dopant with proper concentration.

The method of forming the p-type transition layer (the p-type transition layer is as a strain modulation layer that decreases the tension strain.) includes the following steps:
1. Controlling the composition of aluminum during the epitaxy or a dopant of magnesium to reduce the strain between epitaxial layers and p-type cladding layer.
2. To reduce the strain between epitaxial layers and p-type cladding layer, upon interruption of epitaxial growth, controlling the interruption time to alter the strain in proportion to epitaxial layers, wherein the interruption time is in a range of from one second to two minutes.
3. To reduce the strain between epitaxial layers and p-type cladding layer, upon interruption of the epitaxial growth, changing the temperature to alter the strain in proportion to epitaxial layers, wherein the said temperature is in a range of from 5° C. to 300° C.
4. To reduce the strain between epitaxial layers and p-type cladding layer, upon interruption of the epitaxial growth, forming several monolayers of gallium, indium or aluminum on the surface of p-type cladding layer to alter the strain, wherein the number of monolayers is from one to five.

The method of forming said p-type ohmic contact layer is to utilize epitaxial growth to increase bis(cyclopentadienyl) magnesium ($Cp_2Mg$) flow or reduce temperature to increase magnesium doping concentration.

Figure 3:
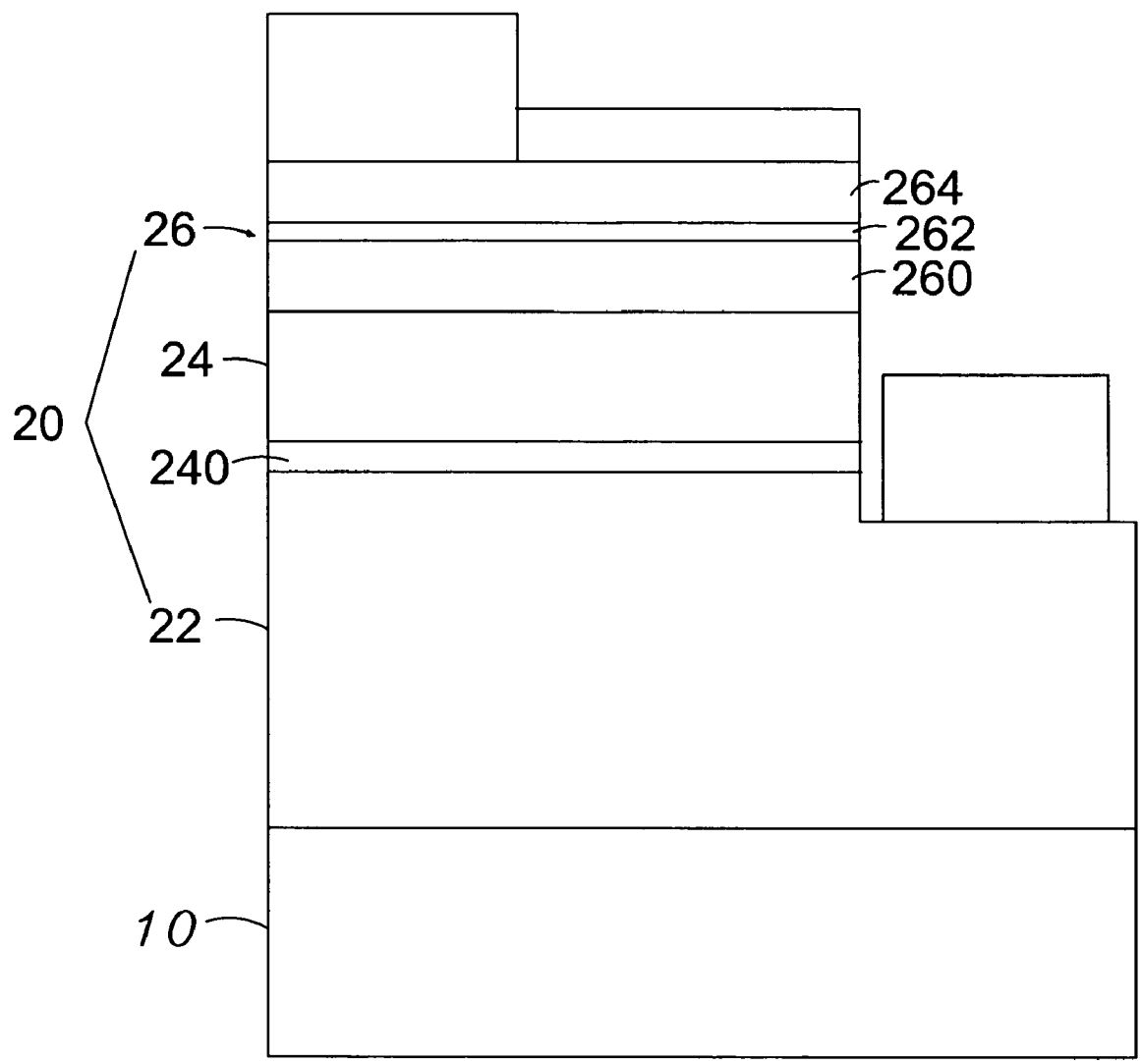
FIG. 3 is a sectional view illustrating a preferred embodiment of light emitting diode according to the present invention.
Figure 4A:
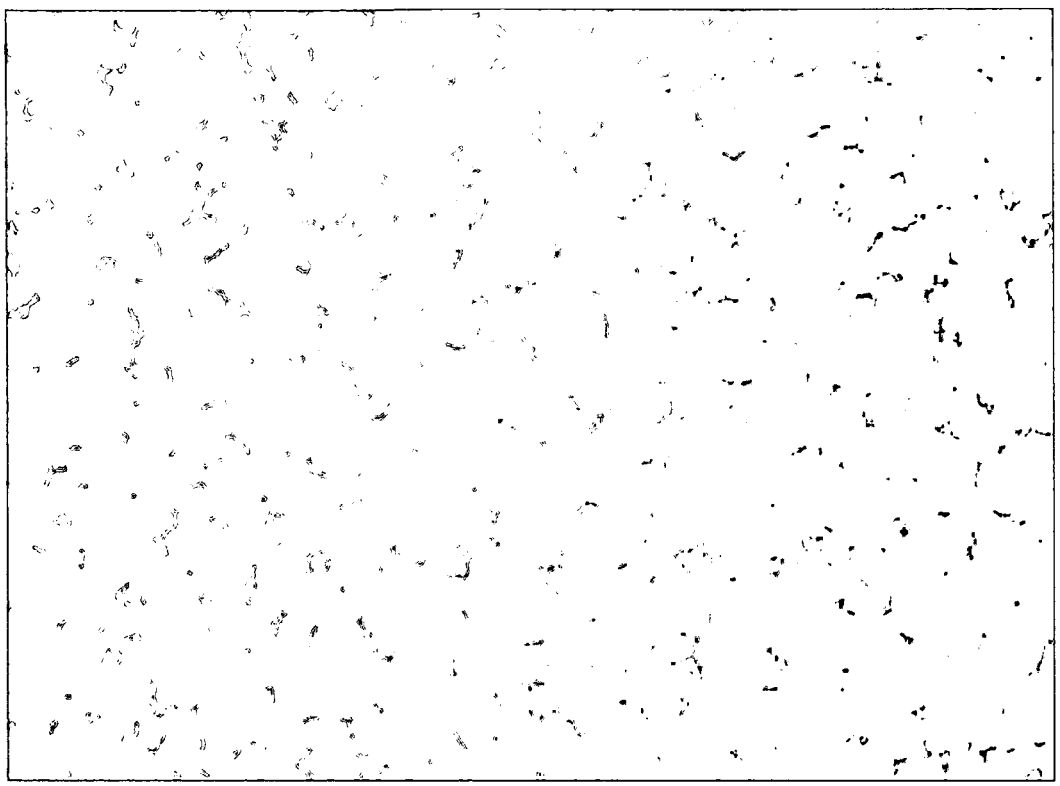
FIG. 4A~4E are surface photographs showing p-type semiconductor layer having a textured structure according to the preferred embodiment of the present invention.
Figure 4B:
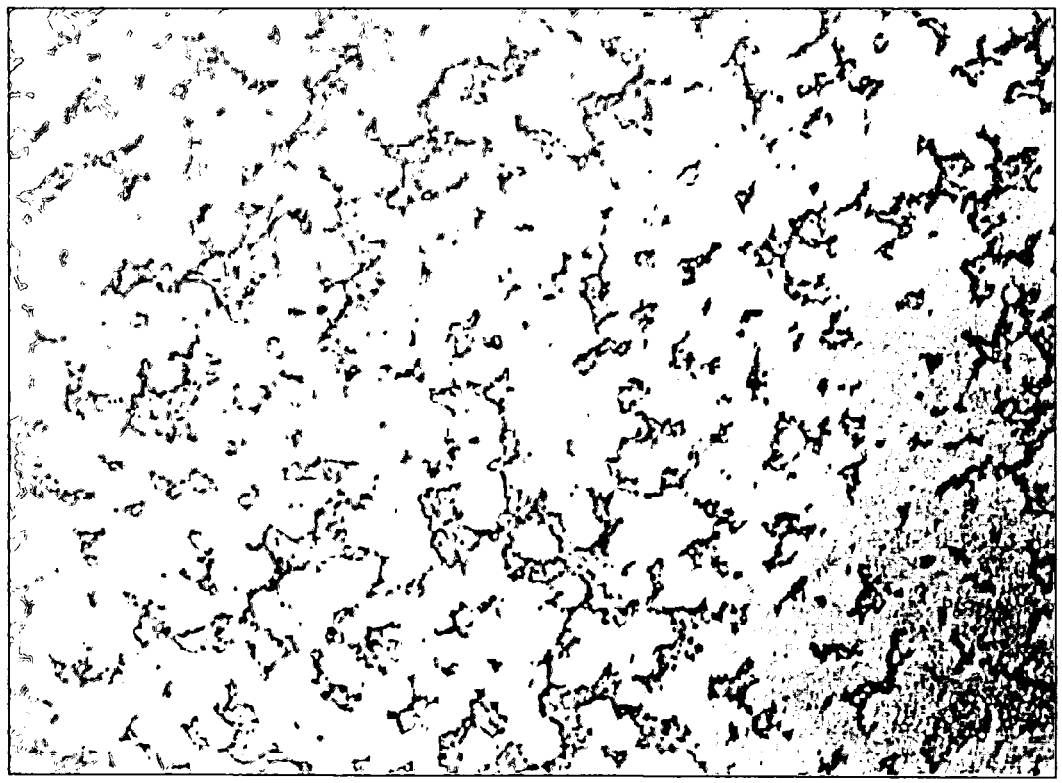
Figure 4C:
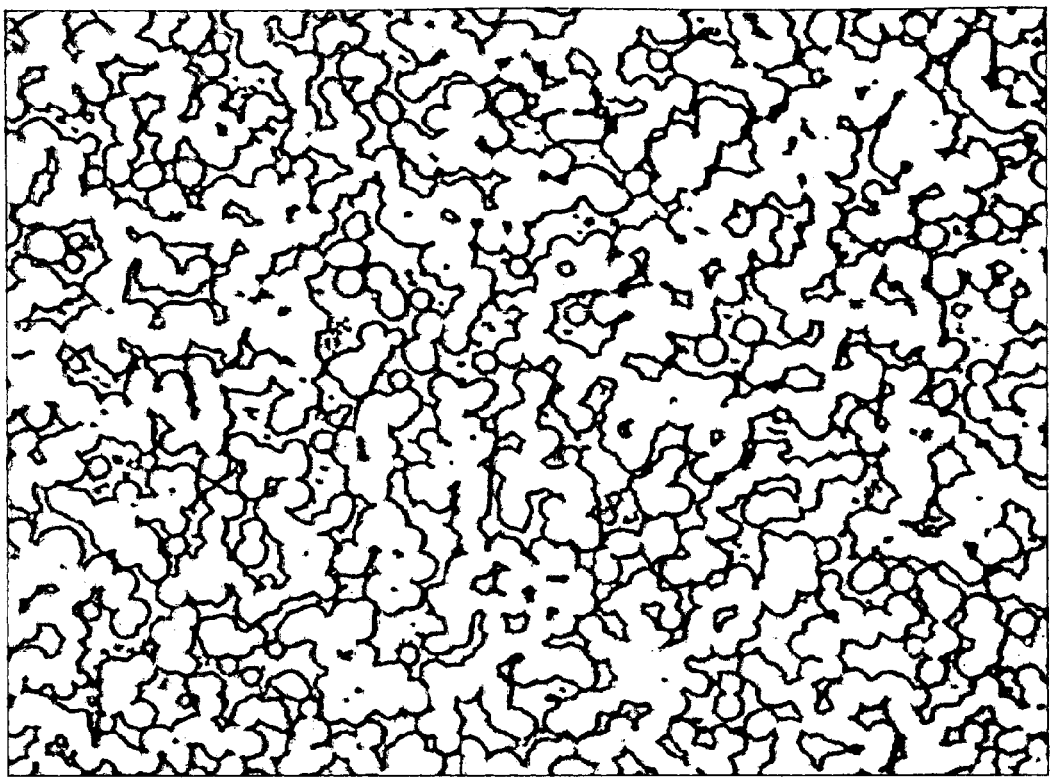
Figure 4D:
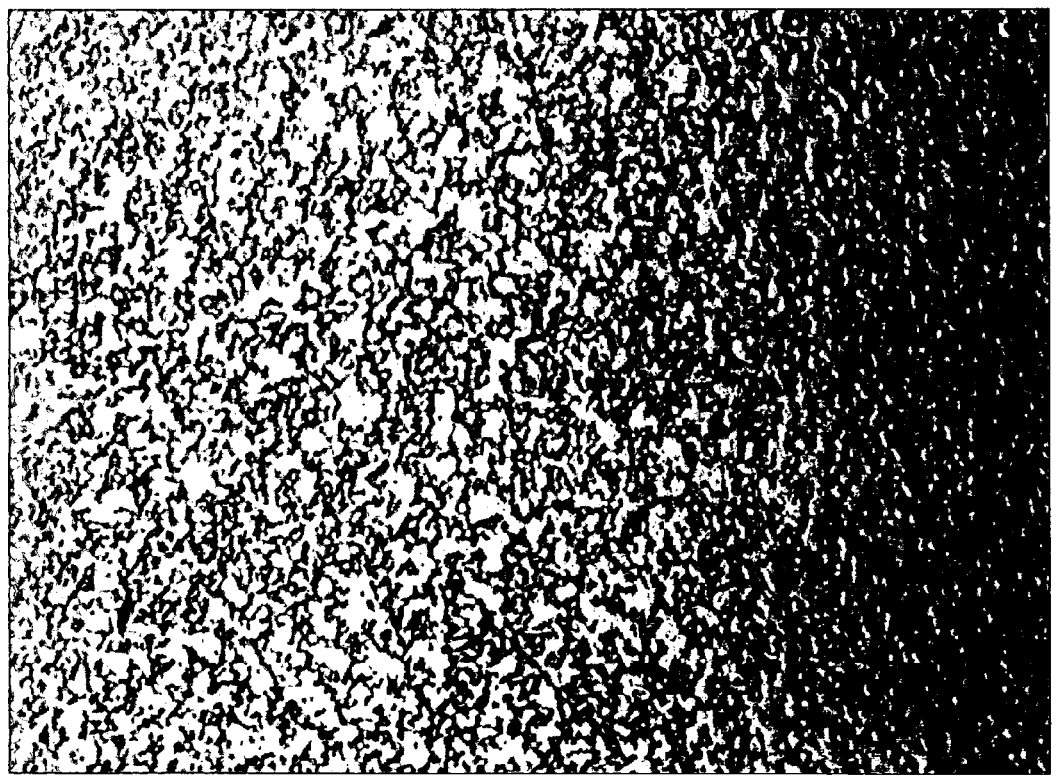
Figure 4E:
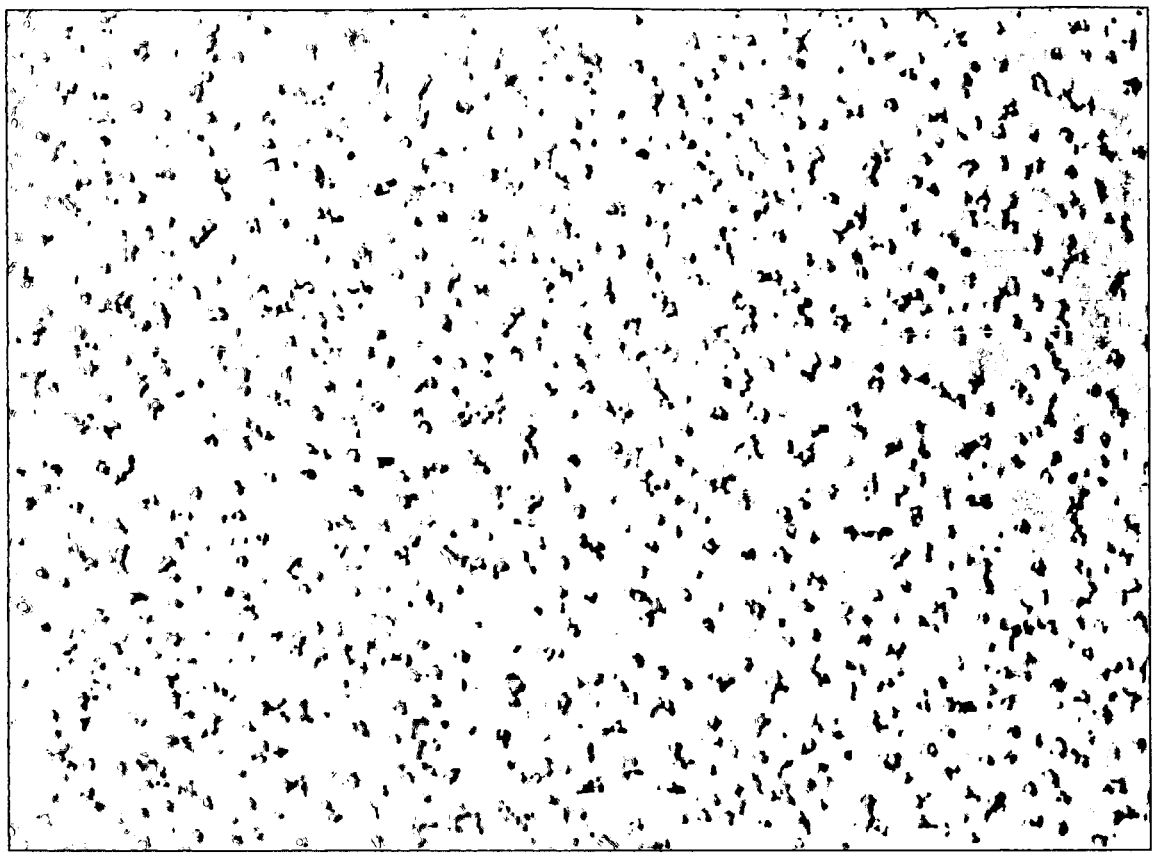

Referring to FIG. 3, which is a schematic diagram of one of a preferred embodiment of light emitting diode of the present invention, the main structure of a high light efficiency of GaN-series of light emitting diode includes: a substrate 10 located on the bottom of the light emitting diode device; a semiconductor layer 20 which includes a n-type semiconductor layer 22, a light emitting layer 24 and a p-type semiconductor layer 26 formed on the top of said substrate 10, wherein the light emitting layer 24 is located between the n-type semiconductor layer 22 and the p-type semiconductor layer 26. The p-type semiconductor layer 26 further includes a p-type cladding layer 260, a p-type transition layer 262 and p-type ohmic contact layer 264, sequentially grown on the light emitting layer 24. The p-type cladding layer 260 is a cladding layer having an increased strain. The LED further contains a reflection layer 240 whose structure could be a Distributed Bragg Reflector having stacked semiconductor layers formed under the light emitting layer 24. Hence, the Distributed Bragg Reflector is connected with the light emitting layer 24 and is below the light emitting layer 24.

The substrate 10 is selected from a group comprising sapphire, silicon carbide, zinc oxide, zirconium diboride, gallium arsenide or silicon; and the n-type semiconductor layer 22 can be presented as N—$B_xAl_yIn_zGa_{1-x-y-z}N_pAs_q$ ($0 \leq x \leq 1$, $0 \leq y \leq 1$, $0 \leq z \leq 1$, $0 \leq p \leq 1$, $0 \leq q \leq 1$, and $x+y+z=1$, $p+q=1$), or presented as N—$B_xAl_yIn_zGa_{1-x-y-z}N_pP_q$ ($0 \leq x \leq 1$, $0 \leq y \leq 1$, $0 \leq z \leq 1$, $0 \leq p \leq 1$, $0 \leq q \leq 1$, and $x+y+z=1$, $p+q=1$); the p-type semiconductor layer 26 can be presented as P—$B_xAl_yIn_zGa_{1-x-y-z}N_pAs_q$ ($0 \leq x \leq 1$, $0 \leq y \leq 1$, $0 \leq z \leq 1$, $0 \leq p \leq 1$, $0 \leq q \leq 1$, and $x+y+z=1$, $p+q=1$), or presented as P—$B_xAl_yIn_zGa_{1-x-y-z}N_pP_q$ ($0 \leq x \leq 1$, $0 \leq y \leq 1$, $0 \leq z \leq 1$, $0 \leq p \leq 1$, $0 \leq q \leq 1$, and $x+y+z=1$, $p+q=1$). The light emitting layer 24 can be composed of one of $B_xAl_yIn_zGa_{1-x-y-z}N_pAs_q$ ($0 \leq x \leq 1$, $0 \leq y \leq 1$, $0 \leq z \leq 1$, $0 \leq p \leq 1$, $0 \leq q \leq 1$, and $x+y+z=1$, $p+q=1$), or presented as $B_xAl_yIn_zGa_{1-x-y-z}N_pP_q$ ($0 \leq x \leq 1$, $0 \leq y \leq 1$, $0 \leq z \leq 1$, $0 \leq p \leq 1$, $0 \leq q \leq 1$, and $x+y+z=1$, $p+q=1$), or a combination of both to form quantum well structure.

The p-type transition layer 262 and the p-type ohmic contact 264 are superlattice structure composed of a semiconductor layer. The superlattice structure can include stacked semiconductor layers having different compositions, thickness, and doped concentration.

The p-type semiconductor layer 26 has a textured surface that can interrupt the optical waveguide effect. The p-type cladding layer has magnesium doping concentration in a range of from $5 \times 10^{19}$ to $5 \times 10^{20}$ $cm^{-3}$, the said p-type transition layer has magnesium doping concentration in a range of from $5 \times 10^{17}$ to $5 \times 10^{19}$ $cm^{-3}$. The magnesium doping concentration of said p-type ohmic contact layer is between the p-type cladding layer and p-type transition layer; wherein the textured surface (the textured surface is a nitrogen-polarity surface and the textured surface is free from defect pits.) of said p-type semiconductor layer 26 is shown in FIGS. 4A-4E which exhibit the texture of SEM of p-type semiconductor layer of a preferred embodiment of the present invention. It illustrates that the texture is generated during the epitaxial process. The p-type nitride semiconductor layer has a nitrogen-polarity surface, which is generated from controlling the magnesium doping profile during epitaxy of p-type nitride semiconductor layer but not by the post machining process as in the prior art. Therefore, the texture can be generated during the epitaxial process to achieve the purpose of interrupting optical waveguide effect.

The present invention is a method of directly controlling the texture generation without post machining during manufacturing. The texture generated on the p-type semiconductor layer scatters the light to interrupt optical waveguide effect caused by multiple interface reflection of the light in the structure including the substrate and resin capper materials for packaging, thereby increasing external quantum efficiency and reducing generation of hexagonal shaped pits to increase the operation life of device.

While certain preferred embodiments of the present invention have been disclosed in detail, it is to be understood that various modifications may be adopted without departing from the spirit of the invention or scope of the following claims.

The invention claimed is:

1. A GaN-series light emitting diode having a high light efficiency, comprising:
    a substrate;
    a semiconductor layer formed on said substrate and including an n-type semiconductor layer;
    a p-type semiconductor layer;
    a light emitting layer sandwiched between said n-type semiconductor layer and said p-type semiconductor layer;
    a reflection layer located between said light emitting layer and said n-type semiconductor layer, said reflection layer having one side thereof in contiguous contact with said light emitting layer and opposing side in contiguous contact with said n-type semiconductor layer;
    wherein said p-type semiconductor layer includes a p-type cladding layer, a p-type transition layer, and a p-type ohmic contact layer sequentially formed on said light emitting layer, said p-type semiconductor layer having a predetermined profile of dopant concentration extending therethrough, wherein a first concentration of dopants in said p-type cladding layer is higher than a second concentration of dopants in said p-type transition layer, and wherein a concentration of dopants in said p-type ohmic contact layer falls between said first and second concentrations of dopants; and wherein said p-type semiconductor layer has a textured surface formed during epitaxial growth of said p-type semiconductor layer as the result of a strain created in said p-type cladding layer and controlled by forming said predetermined profile of said dopants concentration, said textured surface being substantially void of hexagonally shaped defects.

2. The GaN-series light emitting diode in accordance with claim 1, wherein said textured surface of said p-type semiconductor layer interrupts optical waveguide effect in said light emitting diode.

3. The GaN-series light emitting diode in accordance with claim 1, wherein said textured surface of said p-type semiconductor layer is formed by controlling the strain of said p-type cladding layer and said p-type transition layer during the epitaxial growth of said p-type semiconductor layer.

4. The GaN-series light emitting diode in accordance with claim 1, wherein said substrate is selected from a group consisting of sapphire, silicon carbide, zinc oxide, zirconium diboride, gallium arsenide and silicon.

5. The GaN-series light emitting diode in accordance with claim 1, wherein said n-type semiconductor layer is formed from N—$B_xAl_yIn_zGa_{1-x-y-z}N_pAs_q$ ($0 \leq x \leq 1$, $0 \leq y \leq 1$, $0 \leq z \leq 1$, $0 \leq p \leq 1$, $0 \leq q \leq 1$, and $x+y+z<1$, $p+q=1$), or N—$B_{x-}Al_yIn_zGa_{1-x-y-z}N_pP_q$ ($0 \leq x \leq 1$, $0 \leq y \leq 1$, $0 \leq z \leq 1$, $0 \leq p \leq 1$, $0 \leq q \leq 1$, and $x+y+z<1$, $p+q=1$).

6. The GaN-series light emitting diode in accordance with claim 1, wherein said p-type semiconductor layer includes P—$B_xAl_yIn_zGa_{1-x-y-z}N_pAs_q$ ($0 \leq x \leq 1$, $0 \leq y \leq 1$, $0 \leq z \leq 1$, $0 \leq p \leq 1$, $0 \leq q \leq 1$, and $x+y+z<1$, $p+q=1$), or P—$B_xAl_yIn_zGa_{1-x-y-z}N_p P_q$ ($0 \leq x \leq 1$, $0 \leq y \leq 1$, $0 \leq z \leq 1$, $0 \leq p \leq 1$, $0 \leq q \leq 1$, and $x+y+z<1$, $p+q=1$).

7. The GaN-series light emitting diode in accordance with claim 1, wherein said light emitting layer includes $B_xAl_yIn_zGa_{1-x-y-z}N_pAs_q$ ($0 \leq x \leq 1$, $0 \leq y \leq 1$, $0 \leq z \leq 1$, $0 \leq p \leq 1$, $0 \leq q \leq 1$, and $x+y+z<1$, $p+q=1$), or $B_xAl_yIn_zGa_{1-x-y-z}N_pP_q$ ($0 \leq x \leq 1$, $0 \leq y \leq 1$, $0 \leq z \leq 1$, $0 \leq p \leq 1$, $0 \leq q \leq 1$, and $x+y+z<1$, $p+q=1$), or combination thereof to form quantum well structure.

8. The GaN-series light emitting diode in accordance with claim 1, wherein said p-type cladding layer is a cladding layer having the tension strain controlled during epitaxial growth thereof.

9. The GaN-series light emitting diode in accordance with claim 1, wherein said p-type transition layer is a superlattice structure composed by a semiconductor layer.

10. The GaN-series light emitting diode in accordance with claim 1, wherein said p-type ohmic contact layer is a superlattice structure composed by a semiconductor layer.

11. The GaN-series light emitting diode in accordance with claim 1, wherein said first concentration of dopants in said p-type cladding layer includes a concentration of magnesium in a range from $5 \times 10^{19}$ to $5 \times 10^{20}$ cm$^{-3}$.

12. The GaN-series light emitting diode in accordance with claim 1, wherein said second concentration of dopants in said p-type transition layer includes a concentration of magnesium in a range from $5 \times 10^{17}$ to $5 \times 10^{19}$ cm$^{-3}$.

13. The GaN-series light emitting diode in accordance with claim 9 or 10, wherein said superlattice structure includes a plurality of stacked semiconductor layers having different compositions, thickness, and dopants concentrations.

14. The GaN-series light emitting diode in accordance with claim 1, wherein said reflection layer is formed as a Distributed Bragg Reflector including a plurality of stacked semiconductor layers.

15. A GaN-series light emitting diode having a high light efficiency, comprising:
a substrate;
a n-type nitride semiconductor contact layer formed on the said substrate;
a nitride semiconductor light emitting layer formed on said n-type nitride semiconductor contact layer;
a p-type nitride semiconductor cladding layer formed on said nitride semiconductor light emitting layer and having a first concentration of dopants formed therein;
a p-type nitride semiconductor transition layer formed on said p-type nitride semiconductor cladding layer and having a second concentration of dopants formed therein and being lower than said first concentration;
a p-type nitride semiconductor ohmic contact layer formed on said p-type nitride semiconductor transition layer and having a third concentration of dopants formed therein and ranging between said first and second concentrations of dopants; and
at least one metal monolayer structures formed between said p-type nitride semiconductor cladding layer and said p-type nitride semiconductor transition layers.

16. The GaN-series light emitting diode in accordance with claim 15, wherein said metal monolayer structure is selected from a group consisting of aluminum, gallium, indium and other metals from group-III.

17. The GaN-series light emitting diode in accordance with claim 15, wherein said p-type nitride semiconductor ohmic contact layer has a textured surface.

18. The GaN-series light emitting diode in accordance with claim 17, wherein said textured surface of said p-type semiconductor ohmic contact layer is a nitrogen-polarity surface free from defect pits.

* * * * *